United States Patent

Nam et al.

Patent Number: 5,970,312
Date of Patent: Oct. 19, 1999

[54] METHOD FOR EVALUATING HSG SILICON FILM OF SEMICONDUCTOR DEVICE BY ATOMIC FORCE MICROSCOPY

[75] Inventors: Seung-hee Nam, Seoul; Young-sun Kim, Yongin, both of Rep. of Korea

[73] Assignee: Samsung Electronics, Co., Ltd., Suwon, Rep. of Korea

[21] Appl. No.: 09/012,119

[22] Filed: Jan. 22, 1998

[51] Int. Cl.$^6$ ................................................ H01L 21/66
[52] U.S. Cl. .................................................. 438/14; 73/105
[58] Field of Search ................................... 438/14, 17, 18

[56] References Cited

U.S. PATENT DOCUMENTS

| | | | |
|---|---|---|---|
| 5,420,796 | 3/1995 | Weling et al. | 364/468 |
| 5,614,435 | 3/1997 | Petroff et al. | 437/110 |
| 5,776,809 | 7/1998 | Schuegraf | 438/225 |

OTHER PUBLICATIONS

Mitch Haller, Janine Sullivan, George Collins, Multidomain Ellipsometry for Thin Film Process Control, Semiconductor International, Figure 4, Jul. 1998.

*Primary Examiner*—Olik Chaudhuri
*Assistant Examiner*—Daniel H. Mao
*Attorney, Agent, or Firm*—Marger Johnson & McCollom, P.C.

[57] ABSTRACT

An evaluating method of an HSG silicon film using atomic force microscopy (AFM). The characteristics of the HSG silicon film are measured and expressed with quantitative values using AFM. The above values are compared to values written in the working specification, to thereby evaluate the HSG silicon film and control the conditions of forming the HSG silicon film. Also, the capacitor where the HSG silicon film is interposed is formed, and then the capacitance of the capacitor is measured to determine the HSG height of the HSG silicon film for ensuring desired capacitance and conditions of forming the HSG silicon film. Accordingly, the characteristics of the HSG silicon film may be analyzed without damaging the semiconductor substrate and a preferred working specification for forming the HSG silicon film may be realized, to thereby increase the reproducibility of the HSG silicon film. Also, when the conditions of forming the HSG silicon film are determined, it is checked whether the apparatus for forming the HSG silicon film operates normally.

12 Claims, 2 Drawing Sheets

METHOD FOR EVALUATING HSG SILICON FILM OF SEMICONDUCTOR DEVICE BY ATOMIC FORCE MICROSCOPY

BACKGROUND OF THE INVENTION

1. Field of the Invention

The present invention relates to a method of evaluating a semiconductor device, and more particularly, to a method of evaluating a hemispherical grain (HSG) silicon film.

2. Description of the Related Art

An HSG silicon film, which has been developed for increasing the capacitance of a capacitor, is formed on a storage node of the capacitor to increase a surface area of the storage node. The HSG silicon film is formed by seeding an HSG seed on the storage node and then annealing the resulting structure. When the HSG silicon film is formed on the storage node, the surface area of the note increases to twice that of the note when the HSG silicon film is not formed.

A method for evaluating a process and for monitoring an apparatus state and process conditions is necessary for forming the HSG silicon film on the storage node of the capacitor. However, the HSG silicon film cannot be evaluated according to the conventional art. It has therefore been difficult to accurately control conditions for forming the HSG silicon films with the desired capacitance. As a result, consistency in manufacturing HSG silicon films has been hampered.

What the industry needs therefore is an improved method for evaluating an HSG silicon films, and for controlling processing conditions in the manufacture of HSG films.

SUMMARY OF THE INVENTION

To solve the above mentioned problems, it is an object of the present invention to provide a method of evaluating an HSG silicon film of a semiconductor device which is capable of setting a standard in order to form an optimum HSG silicon film without damaging a semiconductor substrate.

Accordingly, the method of evaluating an HSG silicon film of a semiconductor device proceeds as follows:

First, the HSG silicon film on a semiconductor substrate is formed. Next, characteristics of the HSG silicon film are measured and quantified using atomic force microscopy (AFM) and are expressed in quantitative values. And finally, the quantitative values are compared with values of a working specification.

Here, the characteristics of the HSG silicon film which are measured by the AFM are HSG height, HSG area, and surface roughness of the HSG silicon film. Specifically, the characteristics of the HSG silicon film are measured as follows:

First, the semiconductor substrate is loaded to the AFM. Second, a position of the HSG silicon film on the semiconductor substrate is checked for an AFM measurement. Third, a predetermined portion of the HSG silicon film is scanned to get the AFM measurement. Next, signals of the HSG silicon film characteristics obtained by the scanning are processed. And finally, the processed signals are compensated.

According to the evaluating method of the present invention, the characteristics of the HSG silicon film, e.g., surface roughness of the HSG silicon film, HSG height and an HSG area, are expressed in quantitative values using the AFM measurement. These values are then compared to values from working specification. Based on the results of the comparison, a process of forming the HSG silicon film is evaluated and controlled, if necessary. The appropriate HSG height and conditions during formation of the HSG silicon film to achieve the desired capacitance can be determined by forming a capacitor using the method of evaluating an HSG silicon film and by measuring the capacitance of the capacitor.

According to the above evaluating method, the characteristics of the HSG silicon film may be analyzed without damaging the semiconductor substrate and a preferred working specification for forming the HSG silicon film may be realized, thereby increasing the reproducibility of an HSG silicon film within those specifications. Also, when the conditions during formation of the HSG silicon film are determined, the operation of the apparatus for forming the HSG silicon film can be checked.

BRIEF DESCRIPTION OF THE DRAWINGS

The above objects and advantages of the present invention will become more apparent in the following detailed description of a preferred embodiment, made with reference to the attached drawings, in which.

DESCRIPTION OF THE PREFERRED EMBODIMENTS

According to the preferred embodiment of the present invention, an HSG silicon film is evaluated by analyzing characteristics of the HSG silicon film, e.g., surface roughness of the HSG silicon film, as well as a height and an area of HSGs.

Figure 1:
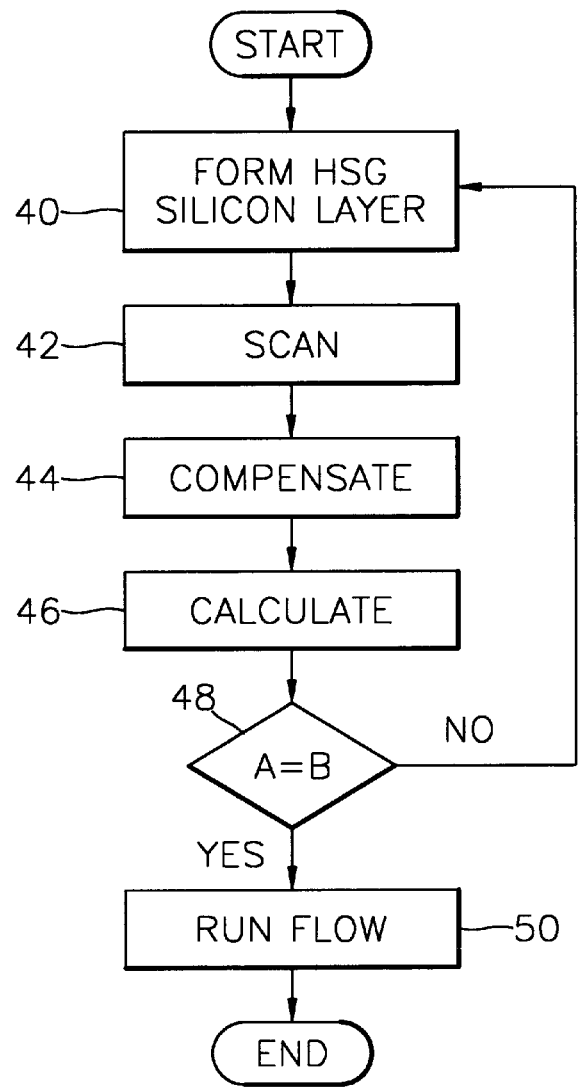
FIG. 1 is a flow chart of a method of evaluating an HSG silicon film of a semiconductor device according to a preferred embodiment of the present invention.

Referring to FIG. 1, a first step 40 comprises forming the HSG silicon film.

Figure 2:
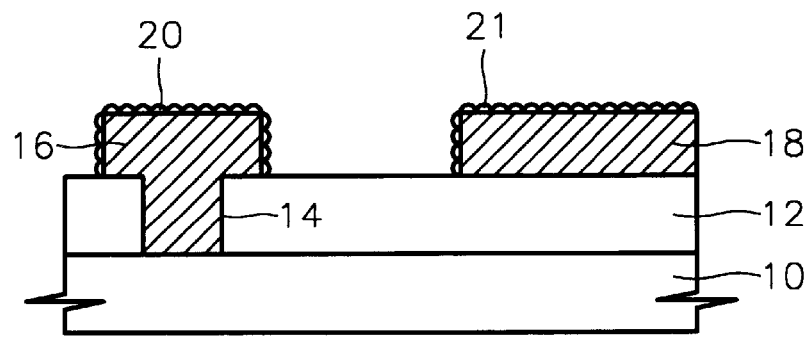
FIG. 2 is a sectional view of a semiconductor device for illustrating the method of evaluating an HSG silicon film according to the preferred embodiment of the present invention.

Referring to FIG. 2, the first step includes forming an interlayer dielectric (ILD) film 12 on a semiconductor substrate 10. Although not shown, a transistor is also formed in the semiconductor substrate 10 and the ILD film 12. A contact hole 14 exposing the semiconductor substrate 10 is formed in the ILD film 12. A conductive layer filling the contact hole 14 is then formed on the ILD film 12. A photolithographic process is performed on the conductive layer in order to form a first conductive layer pattern 16 contacting with the semiconductor substrate 10 through the contact hole 14 on the ILD film 12. At this time, a second conductive layer pattern 18, having a surface on which the HSG silicon film for evaluation is to be formed in a subsequent process, is also formed. The second conductive layer pattern 18 is wider than the first conductive layer pattern 16. Preferably, the second conductive layer pattern 18 has a plate shape. The first conductive layer pattern 16 becomes a storage node of a capacitor. The first and second conductive layer patterns 16 and 18 are formed of an amorphous silicon layer.

Subsequently, first and second HSG silicon films 20 and 21 are formed on the first and second conductive layer patterns 16 and 18, respectively. In particular, the second HSG silicon film 21 is formed for evaluating the characteristics of the HSG silicon film. Each of the HSG silicon films 20 and 21 is formed by a blanket or selective method.

A second step 42 comprises scanning the HSG silicon film. Here, the semiconductor substrate 10 where the first and second HSG silicon films 20 and 21 are formed is loaded to an apparatus for evaluating physical characteristics of the HSG silicon film, e.g., an in-line atomic force microscopy (AFM) apparatus. The AFM apparatus is an apparatus for analyzing a surface of an object using attraction or repelling forces between the object and a scanner tip where a piezoelectric device is installed.

Figure 3:
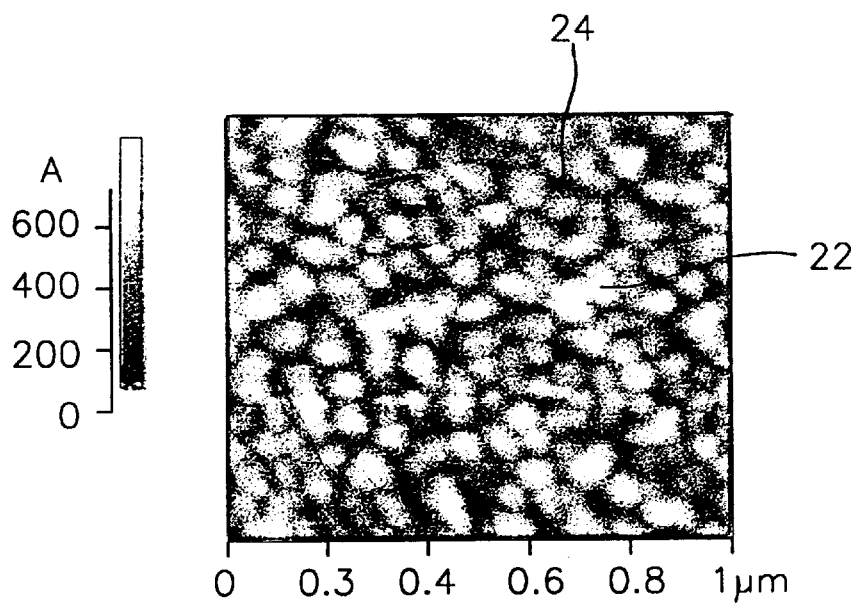
FIG. 3 is an atomic force microscopy (AFM) photograph of an HSG height distribution of the HSG silicon film in the method of evaluating the HSG silicon film of a semiconductor device according to the preferred embodiment of the present invention.

A position of the HSG silicon film, i.e., the second HSG silicon film 21 to be evaluated on the loaded semiconductor substrate 10 is measured using the AFM apparatus. Then, an area of the second HSG silicon film 21 of about $1\times 1\mu m^2$, is partially scanned, to thereby measure the HSG area and surface roughness of the second HSG silicon film 21. At this time, the scanned area is filtered and flattened, to thereby process signals obtained from the area more exactly. Referring to FIG. 3, bright portions 22 of the second HSG silicon film 21 represent HSGs of approximately 600A higher than the approximately 200A represented by dark portions 24. Also, an area of the HSG can be measured by the areas of the bright and dark portions 22 and 24. The surface roughness of the HSG silicon of the scanned portion can be measured by analyzing a distribution of the bright and dark portions 22 and 24 and a concentration of the bright and dark portions thereof. A third step 44 consists of compensating the processed signals. Here, data for the surface roughness of the second HSG silicon film 21, the HSG height, and the HSG area are obtained by the compensation of the process signals.

The scanning and compensation steps are repeated with respect to the same sample. As a result, a plurality of data are obtained from the same sample.

A fourth step 46 comprises processing the data to calculate characteristic values of the second HSG silicon film 21. Specifically, average characteristic values of the second HSG silicon film 21 and allowable errors thereof are calculated using the data. The respective average values of HSG heights, HSG areas, and the surface roughness of the HSG silicon film are a reference for evaluating the HSG silicon film and particularly for evaluating the process of forming the HSG silicon film.

A fifth step 48 comprises comparing the characteristic values of the HSG silicon film to values from a working specification of a semiconductor device. Here, the characteristic value is denoted as 'A', and the value from the working specification corresponding to the characteristic value is denoted as 'B'. As a result, when the value 'A' is substantially equal to the value 'B' from the working specification, within the error range (Y), a next process is performed (step 50).

However, when the reference value 'A' is different from the value 'B' of the working specification, ( i.e., out of the error range (N) ), conditions of the process of forming the HSG silicon film are controlled, and the process returns to the first step 40.

To determine a relationship between the physical characteristics of the HSG of the second HSG silicon film 21 and the capacitance of a capacitor, a dielectric film and a plate node are formed on the resultant structure where the first and second HSG silicon films 20 and 21 are formed, and the capacitor is formed with a cell unit through a photolithographic process. The capacitance of the capacitor is then measured.

Figure 4:
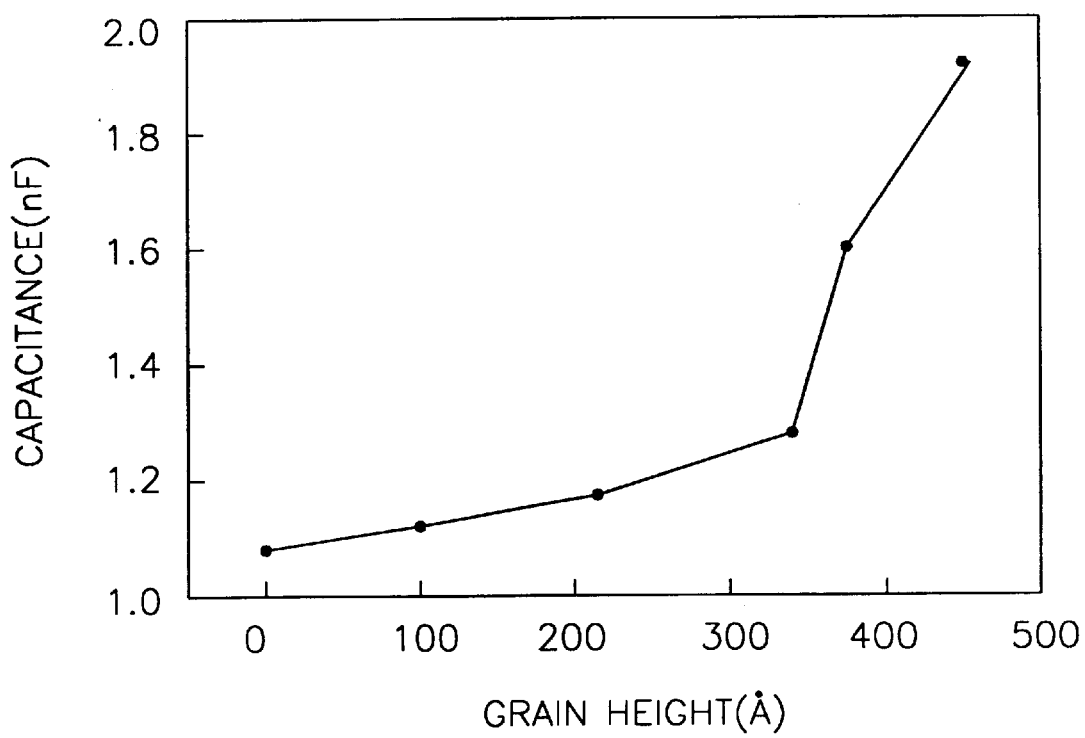
FIG. 4 is a graph showing changes of capacitance of a capacitor according to the HSG heights in the method of evaluating the HSG silicon film of the semiconductor device according to the preferred embodiment of the present invention.

Since areas of the first and second HSG silicon films 20 and 21 are changed by the HSG height, the measured capacitance is also changed by the HSG height. FIG. 4 shows changes of the capacitance according to changes of the HSG heights of the first and second HSG silicon films 20 and 21. Referring to FIG. 4, a horizontal axis and a vertical axis indicate HSG height and capacitance, respectively. The capacitance of the capacitor when the HSG silicon film is formed is higher than that when the HSG height is zero. (The HSG silicon film is not yet formed on the first and second conductive layer patterns 16 and 18.) When the HSG silicon film is formed on the first and second conductive layer patterns 16 and 18 and the HSG height increases, the capacitance also increases.

As a result, when the HSG silicon film is formed on the storage node of the capacitor, the HSG height of the HSG silicon film is expressed in quantitative values by the AFM apparatus, and the change of the capacitance corresponding to the change of the HSG height is determined. Accordingly, when a desired value of the capacitance is determined, the HSG height is determined and conditions of a process of forming the HSG silicon film is also determined. By repeatedly performing the above evaluating method, a preferred working specification with respect to a process of forming an HSG silicon film may be determined and the reliability of a silicon deposition apparatus may be evaluated.

In summary, according to the method of evaluating the HSG silicon film of the present invention, the characteristics of the HSG silicon film, e.g., surface roughness of the HSG silicon film, as well as height and area of the HSG, are measured using AFM apparatus are expressed in terms of quantitative values. The quantitative values are then compared to values from the working specification, in order to evaluate the process of forming the HSG silicon film and to control the conditions during formation of the HSG silicon film if necessary. Additionally, the capacitor is formed using the measured HSG silicon film, and the capacitance of the capacitor is measured to determine the HSG height of the HSG silicon film to ensure the desired capacitance of the capacitor and the maintenance of appropriate conditions during the formation of HSG silicon film with the desired characteristics.

According to this method of evaluation, the characteristics of the HSG silicon film may be analyzed without damaging the semiconductor substrate and a preferred working specification for formation of the HSG silicon film may be realized, thereby increasing the ability to reliably reproduce the HSG silicon film. Also, when the conditions of forming HSG silicon film is determined by the apparatus for forming the HSG silicon film, the HSG height may be measured using the AFM apparatus without damaging the semiconductor substrate, thus allowing verification of whether the HSG silicon film is being formed appropriately and whether the apparatus for forming the HSG silicon film is operating normally. Furthermore, the form of the HSG film may be estimated within the error range by the AFM analysis, thereby allowing a reliable estimate of the structure of the capacitor.

It should be understood that the invention is not limited to the illustrated embodiment and that changes and modifications may be made within the spirit and scope of the following claims and by those skilled in the art.

What is claimed is:

1. An method for evaluating an HSG silicon film of a semiconductor device comprising the steps of:

forming the HSG silicon film on a semiconductor substrate;

measuring characteristics of the HSG silicon film using atomic force microscopy (AFM) to express quantitative values; and comparing the quantitative values to values from a working specification.

2. The method of claim 1, wherein the characteristics of the HSG silicon film are HSG heights of the HSG silicon film.

3. The method of claim 2, wherein the HSG heights of the HSG silicon film are used as characteristic values for evaluating the HSG silicon film.

4. The method of claim 1, wherein the characteristics of the HSG silicon film are HSG areas of the HSG silicon film.

5. The method of claim 4, wherein the HSG areas are used as characteristic values for evaluating the HSG silicon film.

6. The method of claim 1, wherein the characteristics of the HSG silicon film is the surface roughness of the HSG silicon film.

7. The method of claim 6, wherein the surface roughness of the HSG silicon film is used as a characteristic value for evaluating the HSG silicon film.

8. The method of claim 1, wherein the HSG silicon film is comprised of two separate parts for forming a capacitor and an AFM measurement.

9. The method of claim 8, further comprising the step of sequentially forming a dielectric film and a plate node on the HSG silicon film for forming the capacitor.

10. The method of claim 9, wherein capacitance of the capacitor is measured, and then conditions of forming the HSG silicon film are determined according to the HSG height and the capacitance.

11. The method of claim 1, wherein the step of measuring the characteristics of the HSG silicon film comprises the sub-steps of:

loading the semiconductor substrate into an AFM apparatus;

checking a position of the HSG silicon film for obtaining an AFM measurement on the semiconductor substrate;

scanning a predetermined portion of the HSG silicon film to obtain the AFM measurement;

processing signals of the HSG silicon film characteristics obtained by scanning; and compensating the processed signals.

12. The method of claim 1, wherein the conditions of forming the HSG silicon film are controlled by feeding back to the step of forming the HSG silicon film according to a comparison result obtained from of the step of comparing the quantitative values.

* * * * *